United States Patent
Riccardi et al.

(10) Patent No.: US 8,795,791 B2
(45) Date of Patent: Aug. 5, 2014

(54) METHOD AND APPARATUS FOR DEPOSITING NANOSTRUCTURED THIN LAYERS WITH CONTROLLED MORPHOLOGY AND NANOSTRUCTURE

(76) Inventors: Claudia Riccardi, Milan (IT); Moreno Piselli, Milan (IT); Francesco Sirio Fumagalli, Tiano (IT); Fabio Di Fonzo, Milan (IT); Carlo Enrico Bottani, Milan (IT)

( * ) Notice: Subject to any disclaimer, the term of this patent is extended or adjusted under 35 U.S.C. 154(b) by 138 days.

(21) Appl. No.: 13/512,557

(22) PCT Filed: Nov. 30, 2010

(86) PCT No.: PCT/EP2010/068539
§ 371 (c)(1),
(2), (4) Date: May 29, 2012

(87) PCT Pub. No.: WO2011/064392
PCT Pub. Date: Jun. 3, 2011

(65) Prior Publication Data
US 2013/0017342 A1    Jan. 17, 2013

(30) Foreign Application Priority Data

Nov. 30, 2009  (IT) .............................. MI2009A2107

(51) Int. Cl.
*H05H 1/00*    (2006.01)
*B05D 3/14*    (2006.01)

(52) U.S. Cl.
USPC ........................................... 427/535; 427/562

(58) Field of Classification Search
CPC .... C23C 16/513; C23C 16/511; C23C 16/505
USPC ........ 427/535, 540, 561, 562, 564; 118/723 I, 118/723 IR
See application file for complete search history.

(56) References Cited

U.S. PATENT DOCUMENTS

2004/0046130 A1    3/2004  Rao et al.

FOREIGN PATENT DOCUMENTS

EP    0394735 A2    10/1990

OTHER PUBLICATIONS

Fonzo et al., "Hierarchically Organized Nanostructured TiO2 for Photocatalysis Applications," Nanotechnology 20015604, 7 pages, 2009 IOP Publishing Ltd.
Kortshagen et al.; "Plasma Synthesis of Semiconductor Nanocrystals for Nanoelectronics and Luminescence Applications," Journal of Nanoparticle Research, An Interdisciplinary Forum for Nanoscale Science and Technology, Nov. 23, 2006, pp. 39-52, vol. 9, Kluwer Academic Publishers.

*Primary Examiner* — Dah-Wei D Yuan
*Assistant Examiner* — Nga Leung V Law
(74) *Attorney, Agent, or Firm* — Snell & Wilmer LLP

(57) ABSTRACT

A method for producing, by means of plasma, nanostructured thin layers particularly of the hierarchically organized type, and an apparatus for implementing the method, are described. At least a first chamber (10) is provide in which are present an injector (14) of a reagent gas, means (31, 31') for feeding inert gases, and an antenna (16) for the creation of a plasma in said first chamber. Enclosing said first chamber is a second chamber (11) to which a pumping system is connected, containing a housing for the substrate (35) on which the nanostructured film is produced. A wall (12) separates said first chamber from said second chamber and has at least one opening (13). The injector and antenna are arranged in the first chamber with a geometry such that the distance between the outlet of said injector is at a distance of no more than 5 cm from the plane of the surface of said antenna farther from said wall, and said surface is at a distance of no more than 5 cm from said opening.

13 Claims, 5 Drawing Sheets

METHOD AND APPARATUS FOR DEPOSITING NANOSTRUCTURED THIN LAYERS WITH CONTROLLED MORPHOLOGY AND NANOSTRUCTURE

CROSS-REFERENCE TO RELATED APPLICATIONS

This application is a U.S. national phase filing under 35 U.S.C. §371 of PCT/EP2010/068539 filed on Nov. 30, 2010 and claims priority from Italian Application No. MI2009A002107, which was filed on Nov. 30, 2009.

FIELD OF THE INVENTION

The present invention relates to a method for depositing nanostructured thin layers with controlled morphology and nanostructure and an apparatus for implementing the method.

BACKGROUND OF THE INVENTION

Thin layers, deposited on a substrate and having a maximum thickness of the order of tens of micrometers, are commonly known by the term "films", which will be used in the rest of the text.

Thin films can be produced in many ways, for example by techniques known as Chemical Vapour Deposition (CVD) or Physical Vapour Definition (PVD), such as the technique known as sputtering) and their numerous variants. Good productivity is achieved with these techniques, however fine control of the morphology and porosity of the produced film is not possible.

Nanostructured thin films have recently acquired considerable interest. These films consist of nanometric particles, i.e. of dimensions approximately between a few nanometers and a few hundred nanometers.

The interest is due to the fact that these films present functional properties which are new, or of superior quality, compared to non-nanostructured films; for example, nanostructured films are more efficient as photoluminescent sources, in the conversion of radiant energy into electrical energy (property particularly useful for the production of solar panels), or as gas sensors.

A first widely studied possible way to produce these films uses processes carried out in two steps, in which the first step is the production by various ways of powders of nanometric size and their collection, and the second step is the deposition of the powders, for example in the form of pastes or suspensions, which are deposited on the substrate by methods such as silk screen printing or the like. This approach is described in numerous patent documents. For example patent application U.S 2005/0258149 A1 describes a method in which the nanoparticles are produced in a plasma maintained at high temperature (system known in the sector as "plasma torch") and collected directly in oil in a tank, to form a suspension which is then used to produce deposits. Patent application U.S. 2006/0159596 A1 and U.S. Pat. No. 7,052,667 B2 (the latter particularly aimed at the production of carbon nanotubes) describe methods in which the nanoparticles are produced in a high pressure plasma torch system and collected in a trap or on filters, for example of sintered metal or paper, from which they are then recovered, to be then deposited on a substrate by known methods. Finally, patent application U.S. 2009/0056628 A1 describes a method for producing nanoparticles by means of a radiofrequency plasma, and in this case too the particles are then recovered and subsequently used to produce films; alternatively, according to this document, the particles leaving the production reactor can be collected directly on a substrate, to which they adhere by electrostatic attraction (or simply by gravity).

The article "Plasma synthesis of semiconductor nanocrystals for nanoelectronics and luminescence applications", U. Kortshagen et al., Journal of is Nanoparticle Research, (2007) vol. 9, no. 1, pages 39-52, describes the production of nanosized powders of silicon in a non-thermal plasma. In the system of this article, a precursor of silicon (e.g., a silane) is introduced at one end of a quartz tube in which a relatively high gas pressure is kept; a plasma is generated in the whole tube, that decomposes the silicon precursor causing the creation of silicon nanoparticles; the opposite end of the tube is closed by a wall, in which an orifice is present; the wall separates the volume in the quartz tube from a chamber kept at lower pressure; the difference of pressures in the two zones causes the extraction of a jet of the mixture of gasses and silicon nanoparticles present in the quartz tube; the nanoparticles are then collected, for instance on a TEM grid. In the method of this document, as described in particular with reference to FIG. 4 therein, the silicon nanoparticles begin to form already at a position rather distant from the orifice; these particles are initially amorphous and porous, and of relatively high diameter (around 200-400 nm); as the whole volume of the quartz tube is kept in plasma conditions by means of electrodes, the initial particles, in their travel towards the orifice, continue to react and become denser (and smaller) the closer they are to the orifice; once these particles enter the lower-pressure chamber, downstream the orifice, they have already reached their final shape and dimensions (around 40-70 nm), and are collected as such.

These methods generally do not allow control of the aggregation order of the film formed from the nanoparticles, giving rise to films which are essentially disordered and often difficult to reproduce; with these films it is not possible to fully utilize the potentiality of the nanostructured films and to control them.

In this respect it has been observed that the best results in terms of functional properties of films produced from nanometric sized particles are obtained when these aggregate to form structures of greater size in accordance with a growth scheme known in the sector as "hierarchically organized", described for example in the articles "Hierarchically organized nanostructured $TiO_2$ for photocatalysis applications", F. Di Fonzo et al., Nanotechnology 20 (2009) 015604, and "Hierarchical $TiO_2$ Photoanode for Dye-Sensitized Solar Cells", F. Sauvage et al., Nano Letters 10 (2010).

The technique used in the stated article is "pulsed laser deposition" (PLD), in which a source of the material to be deposited is caused to evaporate by a sequence of laser radiation pulses; the evaporated material aggregates to form bunches of atoms or molecules (known in the sector as clusters) which, upon deposition on a substrate, undergo self-organization, according to the process parameters, into dense compact columnar, open columnar or dendritic structures. The limit to this technique, which prevents its application on an industrial level, is its low productivity, due to the fact that the laser can irradiate surface areas of a maximum of a few square centimeters, with an evaporation rate (and consequent deposition on the substrate) of the order of some tens of ng/s or nm/s in terms of the thickness of the deposited film based on its density.

International patent application WO 2009/032654 A1 describes an alternative method for producing hierarchically organized nanostructured films which leads to results similar to those of the aforementioned article. This method consists of introducing into a reaction zone a vapour stream of a compound containing a metal, a fuel vapour stream and an oxidant vapour stream, and cause a combustion to occur within the reaction zone; the combustion results in the formation of fumes of nanoparticles of the metal oxide, which are then deposited onto a substrate maintained at a controlled temperature. This technique presents the drawbacks of being relatively unclean, requiring a fuel to be burned, hence not allowing optimal control of the chemistry of the deposited film.

SUMMARY OF THE INVENTION

An object of the present invention is to provide a method for producing nanostructured films with controlled morphology, particularly of the hierarchically organized type, which overcomes the problems of the known art, and to provide an apparatus for implementing the method.

These objects are attained by the present invention, which in a first aspect relates to a method for producing a nanostructured film, comprising the following steps:
- providing at least one first chamber and a second chamber divided by a wall but in fluid communication with each other through one or more openings;
- providing in the first chamber a planar antenna for the creation of a localized plasma, said planar antenna being placed near or against the wall dividing said first and second chambers, such that the surface of the antenna farther from said wall is at a distance "d" of no more than 5 cm from said wall, and having one or more holes in positions corresponding to said one or more openings in said wall;
- creating a planar non-thermal plasma in a zone facing said surface of the antenna farther from the wall dividing said first and second chamber;
- injecting reagents in gas or vapor phase into said first chamber at a point at a distance "h" of no more than 5 cm from said surface of the antenna farther from said wall, so as to cause the reagents to cross the area of the non-thermal plasma, thus defining a reaction zone where the flow of reagents intersects said plasma, in which molecular species of the desired material are produced;
- through said one or more openings, extracting said molecular species from the reaction zone and directing them towards a deposition zone, defined within said second chamber, in which a substrate for the nanostructured film is disposed;
- maintaining the reaction zone at a pressure $P_R$ comprised between 10 and 100,000 Pa, the deposition zone at a pressure $P_D$ comprised between 0.01 and 10,000 Pa, and the ratio $P_R/P_D$ at a value equal to or greater than 3, thus determining a supersonic gas jet containing said molecular species which is directed from the reaction zone to the deposition zone;
- arranging said substrate along the axis of the supersonic jet at a distance comprised between 0.5 and 10 cm from said one or more openings.

BRIEF DESCRIPTION OF THE DRAWINGS

The invention is illustrated in detail hereinafter with reference to the figurers, in which.

DETAILED DESCRIPTION OF THE INVENTION

Figure 1:
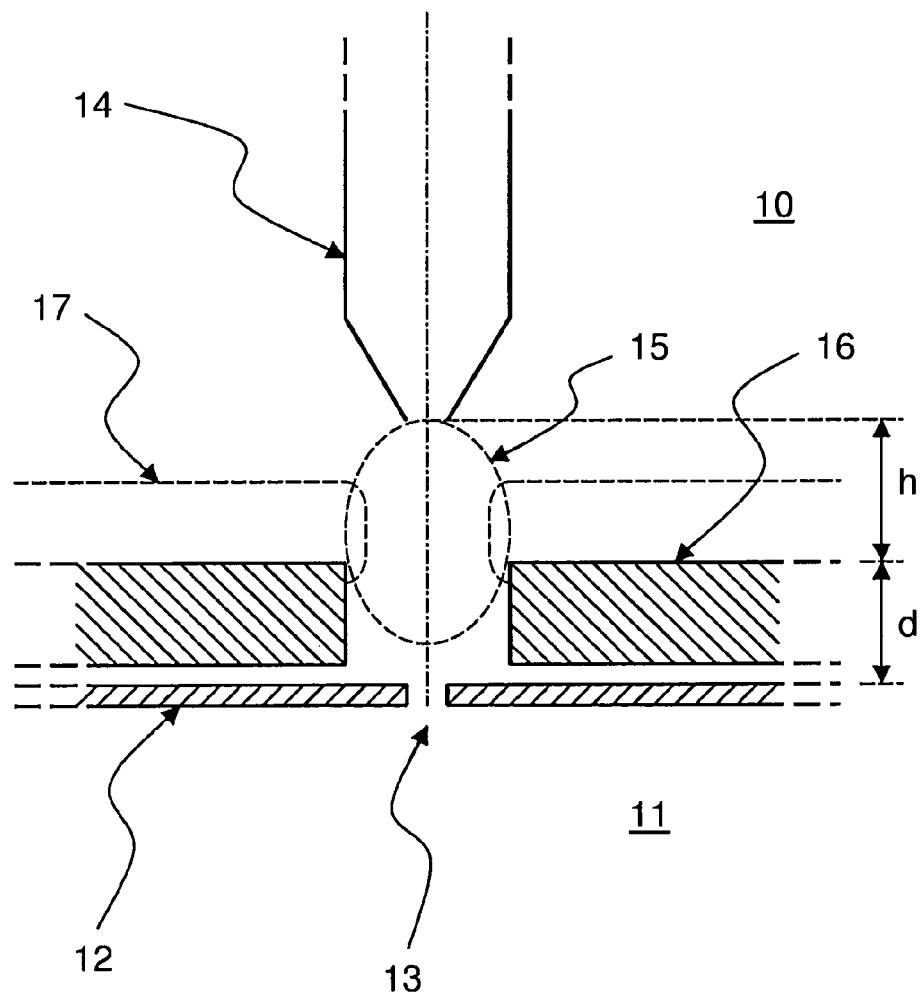
FIG. 1 is a schematic view of the area where the reaction between reagents takes place and where the molecular species formed in the reaction are extracted from the first chamber towards the second chamber.

FIG. 1 shows schematically the zone in which the reaction between reagents takes place in the area where the plasma is formed. The drawing in FIG. 1 is oriented such that the axis along which the reagents species travel is vertical, and in a downward direction, but it could be positioned in any other orientation, provided the mutual geometrical relationships among the parts are maintained (the same holds as well for those in FIGS. 3 and 4); besides, parts in FIG. 1 are not reproduced in scale, and some dimensions may be increased in order to highlight some details of the reaction zone.

In the method of the invention, a first chamber, 10, is divided from a second chamber, 11, by a wall 12 in which a small opening, 13, is present. An injector 14 positioned in the first chamber delivers at least a first reagent gas or vapor in a zone 15; the second reagent can be admixed in the flow coming from the injector 14, or can be delivered in chamber 10 from a different inlet, as shown for example in FIG. 3. In chamber 10, adjacent to wall 12, is present the planar antenna 16 that is used to create a plasma; in the drawing, antenna 16 is shown separated from wall 12, but these could be in contact; besides, no account is given in this drawing of the internal structure of the antenna, responsible of its functionality. The distance between the outlet of injector 14 and the surface of the antenna facing the injector, indicated as "h" in FIG. 1, is an important parameter of the present invention, and is kept at values not higher than 5 cm to avoid that unwanted reactions take place already in undesired zones of chamber 10.

Antenna 16 creates a plasma region 17 comprising a, so called, ionization region and a recombination or diffusion region. In the ionization zone, in close proximity to the antenna, the RF power is converted into electron-ion pair creation. The so created energetic electrons trigger chemical reactions among reagents in the diffusion zone. The boundary of the diffusion zone is governed mainly by operating power and pressure. In high vacuum conditions, it can expand freely filling the whole chamber, while in high pressure regimes it is limited by gas diffusion and recombination/quenching processes.

The thickness of zone 17 can be controlled by modifying operating parameters; said thickness increases increasing the power applied to antenna 16, and decreases increasing the pressure of gases in chamber 10.

From the above discussion is clear that the plasma zone 17 is not sharply delimited from the surrounding area and it is mainly localized in zone 17, schematically represented by a dotted line. In this zone the density of electrons, ions and excited species is sufficient to cause chemical reactions among reagents; outside this zone, said density fades away, to values that become inefficient for the aims of the invention. Similar considerations apply for zone 15, where the reagent flow coming from injector 14 as the higher concentration, but lower concentrations of the same are present also outside said zone. The intersection between reagents zone 15 and plasma zone 17 defines the reaction zone, in which the reagents are decomposed or react to form the molecular species target of the method.

The reaction zone lies within the space in which a nonthermal plasma is generated. This type of plasma presents independent thermodynamic equilibrium situations for the various classes of particles present, leading to a large difference between the average energy of the electrons (which absorb energy directly from the generator) and that of the ions (approximately in equilibrium with the base gas); in other words, the electrons are at very high temperatures, of the order of units of eV, whereas the gas and ions do not undergo substantial heating by the plasma inductor. This enables chemical reactions to be obtained which are "catalyzed" by high energy electrons while maintaining the macroscopic reactor temperature close to ambient. The molecular species of the desired material form within the reaction zone.

Figure 2:
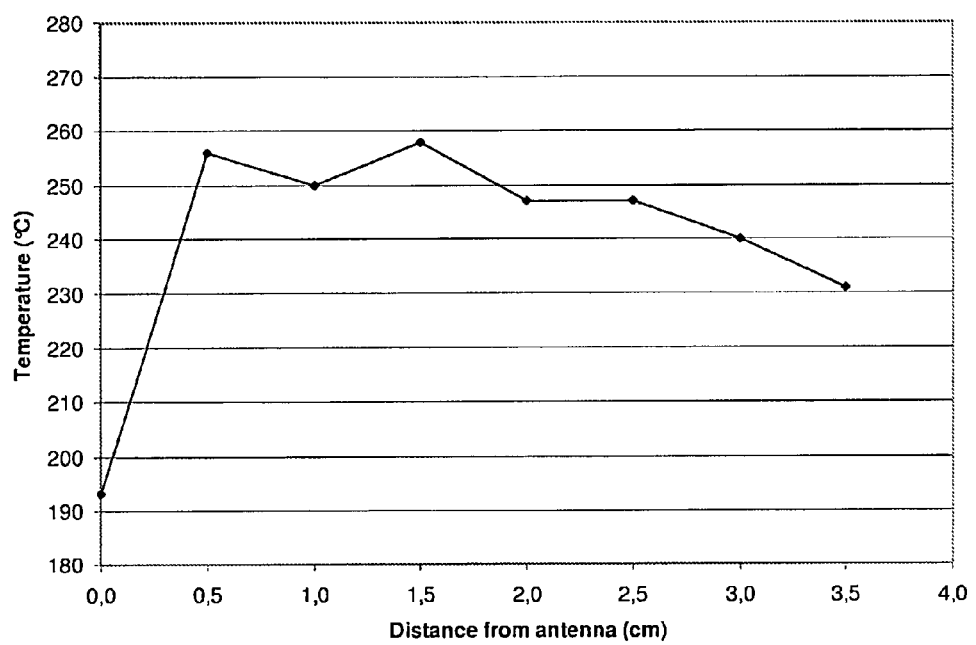
FIG. 2 is a graph representing the trend of temperature along the axis of the reaction zone.

FIG. 2 shows the temperature trend along the axis of FIG. 1. In the graph of FIG. 2, the values in abscissae represent the distance, in the upward direction, from the plane corresponding to the upper surface of the planar antenna; the temperatures indicated in the graph of FIG. 1 have been measured by inserting a thermocouple in the reaction zone and moving along the axis of the same. As can is be noted, the temperature in the reaction zone has a sharp increase of about 70° C. passing from the level of the upper surface of the antenna to a height positioned 0.5 cm away from said surface; it is essentially constant in the "slab" between 0.5 and 2.5 cm from said surface; and then decreases smoothly but constantly at higher distances from said surface. Given this temperature profile, essentially all reactions between the reagents take place in a planar zone positioned between about the plane of the upper surface of the antenna and a parallel plane less than about 5 cm far from said surface.

In the zone between the plane of the upper surface of the antenna and opening 13, of height "d", the temperature is too low for reactions among reagents to take place. Height "d" is maintained lower than 5 cm, preferably lower than about 2 cm, in order to avoid that nucleation of molecular species formed in the reaction zone takes place already in this part of the chamber, before said species are extracted from opening 13; it is preferably kept at the minimum possible value, and is generally only limited by the constructive needs of the antenna, that generally has a minimum thickness in the range between about 1-1.5 cm.

As a consequence of the above picture, in the method of the invention the maximum distance between injector 14 and opening 13 is limited to values lower than about 10 cm, and is preferably lower than about 5 cm. Given this limited distance, and the speed of species in the relevant area (reaction zone and between the latter and opening 13), the residence time in chamber 10 of the molecular species formed in the reaction zone is so short that essentially no nucleation of the produced molecules, and dimensional growth of particles made up of these, may happen in chamber 10. Nucleation of the reaction products and consequent growth of particles only takes place downstream the opening 13.

The molecular species produced in the reaction zone are extracted from the reaction zone through opening 13 by a supersonic jet which is generated because of the difference between the pressure in the reaction zone and that in the deposition zone when these pressures are such that the relationship $P_R/P_D \geq 3$ is verified. The $P_R$ values useful for the purposes of the invention are comprised between 10 and 100,000 Pa, and preferably between 10 and 10,000 Pa, whereas the $P_D$ values are comprised between 0.01 and 10,000 Pa, and preferably between 1 and 3000 Pa.

By properly selecting the pressures in the two chambers, the dimensions of opening 13 and the distance between the latter and the substrate onto which the growing particles impinge, it is possible to control the morphology of the resulting film. This is completely different from the results of the method of the article of Kortshagen described before, in which the evolution of the particles undergo shrinking in a reaction zone about 20 cm long, passing from a starting porous and amorphous morphology to a completely dense structure; the evolution of these particles is thus completed in the reaction zone; and the formed particles are collected in a low pressure chamber in the form of free particles or of a loosely coherent deposit, that is not a real and stable thin film and, more important, the morphology of which cannot be controlled.

In a second aspect thereof, the invention is about an apparatus for carrying out the method described above.

Figure 3:
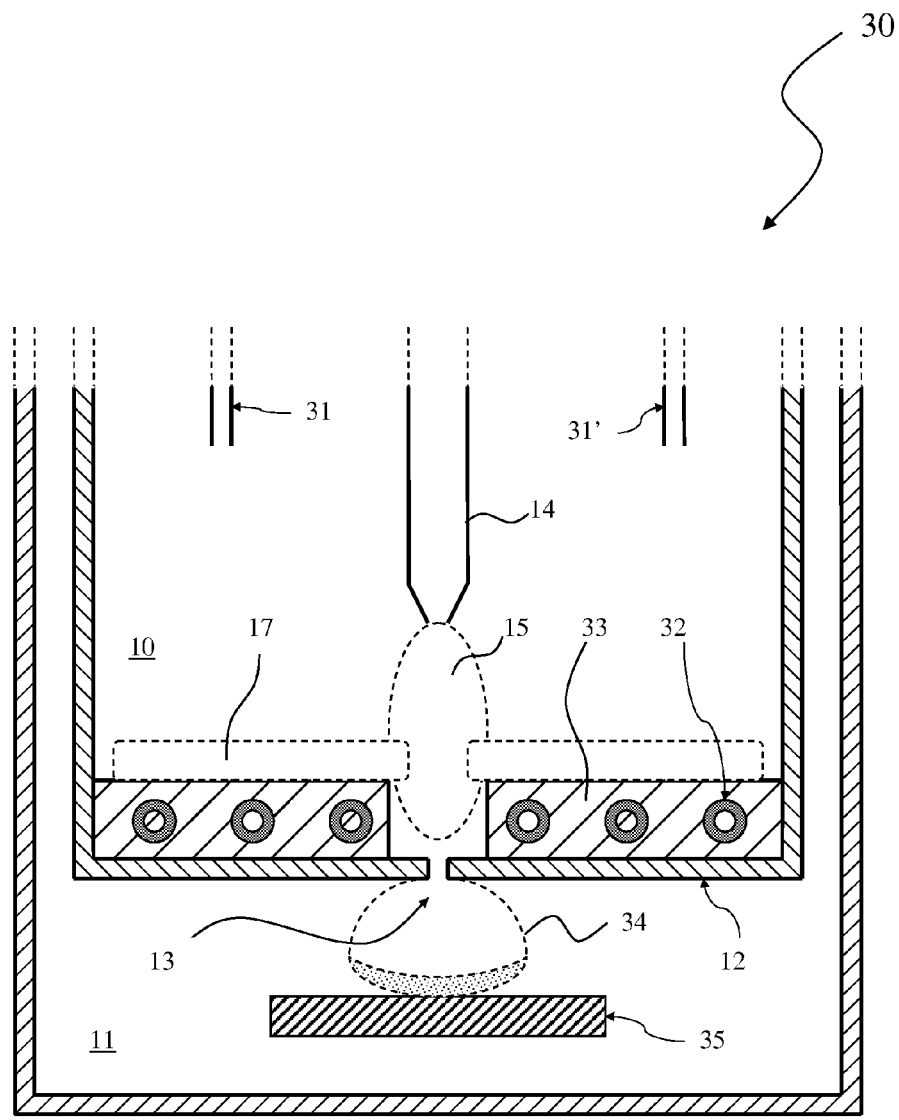
FIG. 3 is a schematic cross-section view of a base unit forming the apparatus for implementing the method of the invention.

A preferred configuration of the apparatus of the invention is shown in cross-section in FIG. 3, in its most simple and general configuration; in the drawing in FIG. 3, numerals 10 to 17 have the same meaning as in FIG. 1. In the preferred embodiment of FIG. 3, the antenna is of the inductive coupling (ICP) kind, but other source types are possible, as detailed hereinafter. Apparatus 30 is formed from a first chamber 10, inserted into a second chamber 11, these being separated by a wall 12. The first chamber is provided with an injector 14 of at least a reagent gas or vapor, and means 31, 31' for feeding into the chamber the gases in which the plasma is to be formed; the outlet of injector 14 is at a distance of no more than 5 cm from the plane of the surface of the antenna farther from wall 12, while the distance from said surface and said opening is no more than 5 cm, preferably no more than 2 cm, and even more preferably lower than 1.5 cm. The reagents are generally at least one precursor compound of an element, which can be a metal, a metalloid or another element not gaseous at ambient temperature and pressure, and at least one gas which has to react with said precursor. Typically the reagents are diluted in an inert gas (the main function of which is to facilitate the generation and sustaining of the plasma). The precursors as defined above are fed into the chamber through the injector 14, while the reactive gases may be fed into the chamber through injector 14 as well, or diluted in the inert gas fed by the means 31, 31'. The apparatus comprises an energy source 32 for creating the plasma; the energy source (e.g., a copper coil) is immersed in a body 33 of dielectric material, commonly a ceramic such as alumina. Wall 12 has a small-dimension opening 13, which can be an orifice in the wall or a nozzle connected to it. During operation of the method, from the opening 13 a supersonic jet 34 is emitted, formed by the plasma gas containing particles formed in the reaction zone, that for this reason is defined in the art as a "seeded jet".

In the second chamber the substrate 35 is present, on which the nanostructured film is to be formed; the zone struck by the jet 34, in which the substrate is disposed, is defined deposition zone. A pumping system (not shown in the figure) is connected to this chamber to enable the necessary pressure difference to be maintained between the two chambers, and in particular between the reaction zone and the deposition zone.

The reaction and deposition zones are separate but in fluid connection with each other via the opening 13. The two zones are maintained at different pressure values $P_R$ and $P_D$ and in particular such that the $P_R/P_D$ ratio is equal to at least 3.

As is well known to fluid dynamics experts, the pressure ratio between two zones connected by an opening is determined, for a given conductance value of the opening, by controlling the total gas flow rate within the system and the pumping rate in one of the two zones. In detail, in the case of the present invention, the mathematical relationship relating these quantities is the following:

$$P_R/P_D = 1 + Q/C_{RD} \cdot P_D$$

in which:
P$_R$ and P$_D$ have the aforementioned meanings;
Q is the volumetric throughput of the system, measured in (m$^3$·Pa/s)
C$_{RD}$ is the gas conductance between the two zones connected by the to opening, measured in (m$^3$/s); the conductance is determined by the dimensions of the opening.

Given the desired values of P$_R$ and P$_D$ and the value of Q, the dimensions of the opening 13 are easily determined, also through the technical data sheets of the calibrated apertures sold for these purposes.

The films able to be produced according to the invention can consist of metals, semiconductors (elemental or compounds), oxides or other ceramic compounds, such as nitrides, carbides or borides, or conductor compounds. In case of production of metals or elemental semiconductors (silicon or germanium) the reagents to be used can be a volatile compound of the metal or semiconductor element, and a reducing agent, for example hydrogen, to obtain the general reaction:

MX$_n$+H$_2$M+HX    (I)

An example of this type of reaction is the one of silicon formation:

SiCl$_4$+2H$_2$→Si+4HCl    (II)

Semiconductor compounds can be obtained in a similar manner by injecting into the reaction zone, further to hydrogen, the precursors of the two (or more) constituent elements of the material, for example a precursor of arsenic and a precursor of gallium to obtain the III-V compound GaAs. Isolating materials such as nitrides, carbides or borides can be likewise obtained.

To obtain oxides, the precursor (or precursors) of the metal (or metals) of which the oxide is to be formed, plus oxygen, are injected into the reaction zone, in accordance with the general reaction:

MX$_n$+O$_2$→MO+nX    (III)

An example of this type of reaction is the one for forming titanium dioxide from the metal tetraethoxide:

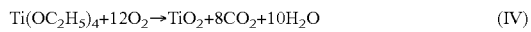
Ti(OC$_2$H$_5$)$_4$+12O$_2$→TiO$_2$+8CO$_2$+10H$_2$O    (IV)

By using suitable precursor mixtures, compounds of several elements can be produced (for example mixed oxides of two or more metals), or films of doped materials.

The aforesaid precursor compounds can be gaseous, liquid or solid at ambient temperature and pressure. In the case of gaseous precursors they can be to injected into the reaction zone as such; in the case of liquid precursors they can be used in vapor phase and can be transported into the reaction zone for example by a stream of an inert gas or of the same gas with which the reaction takes place (for example hydrogen or oxygen); finally, in the case of solid precursors, injection of the elemental species into the reaction zone can take place for example by is sputter erosion of a source of the precursor, by applying a suitable potential difference between the solid source and another part of the apparatus, as well known to experts in the art. Even though more complex, this solution ensures greater purity of the materials produced.

The substrate 35 on which the nanostructured film is to be grown is positioned within the deposition zone at variable distances along the axis of the seeded supersonic jet. The substrate can be fixed or movable. By choosing an opening in the form of a circular or rectangular slit in a thin wall, the jet expands as it withdraws from the nozzle to assume the characteristic "plume" shape. Along the expansion axis the species formed within the reaction zone firstly nucleate into clusters and then grow into nanoparticles. The advancement front of the plume is limited by a shock zone, known as Mach disc (identified in FIG. 3 by the half moon-shaped part more distant from the opening 13), through which the nanoparticles undergo a sudden deceleration. The distance of the Mach disc from the opening, along the jet axis, depends on the shape of the opening and is determined by the ratio between the pressures in the reaction zone and deposition zone. In the case of a circular opening, said distance is defined by the relationship:

$$x_M = d \cdot 0.67 (P_R/P_D)^{1/2}$$

in which x$_M$ is the distance between the opening and the Mach disc and d is the diameter of the opening; whereas in the case of a rectangular opening the relationship is:

$$x_M = h \cdot (w/h)^{0.47} \cdot 0.67 (P_R/P_D)^{1/2}$$

in which w and h are respectively the slit width and height; the quantity of w/h is known as the "aspect ratio".

Figure 5:
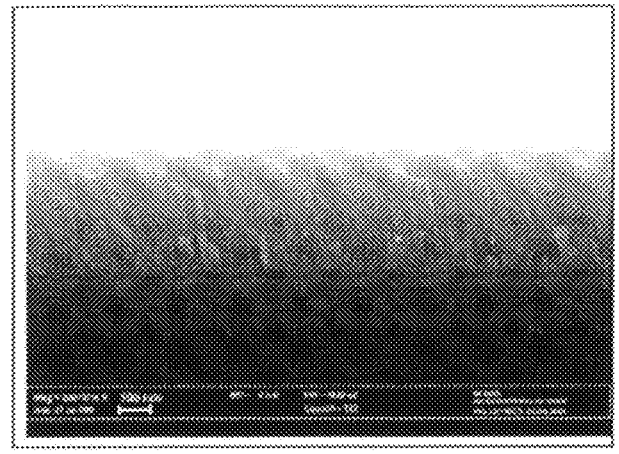
FIG. 5 is a microphotograph of a section of a compact nanostructured film obtained according to the invention.
Figure 6:
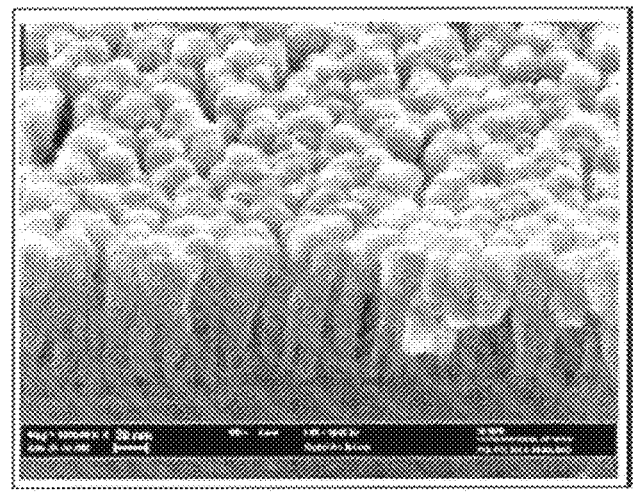
FIG. 6 is a microphotograph of a section of a porous nanostructured film obtained according to the invention.

By controlling the nozzle-substrate distance, species of different dimensions and energies can be intercepted: a few very energetic atoms for small distances, nanoparticles with decreasing kinetic energy for increasing distances, in particular beyond the shock zone. In this manner, the energy and dimensions of the basic elements of the film to be grown can be selected. For example, by operating with a very low nozzle-substrate distance, indicatively between 0.5 cm and a few cm, the species generated in the reaction zone do not have time to form nanoparticles and deposit in the form of compact films with minimal surface roughness (such as that shown in the microphotograph of FIG. 5), whereas on increasing said is distance the obtained films are more and more porous and nanostructured (such as that shown in the microphotograph of FIG. 6). The film morphology is also controlled by the P$_D$ value, with low pressures tending to favor compact film formation, while relatively high pressures favor the formation of high porosity hierarchical nanostructures.

To generate the plasma an inductive coupling source (ICP), a capacitive coupling source (CCP), a microwave source (MW), an electron cyclotron resonance source (ECR) or a source of the dielectric barrier type (DBD) can be used. The electromagnetic power can be coupled to the plasma in a wide range of frequencies to generate a discharge that will fulfill the aims of this invention; the possible frequency range of the sustaining voltage for these discharge types is very broad, reaching from line frequency (50 Hz), low frequency (some kHz), radio frequency (1-100 MHz), technically preferred frequencies are 13.56 MHz and 27.12 MHz, up to microwaves (in the latter case 2.45 GHz is the mostly used frequency). The coupling schemes can include continuous wave or pulsed mode. The first type is preferred because an ICP source has the advantage of generating a plasma with a low impurity level (the electrode/antenna is physically separated from the reaction zone) and with greater electronic densities (even 3 orders of magnitude greater) compared with the analogous CCP solution, which requires direct contact between the electrodes and the discharge zone. Greater electronic densities in the low energy region result in a greater number of anaelastic collisions which result in the production of radicals/atoms in an excited electronic state. The energy coupling mechanism of an ICP (EM wave generated by the antenna, transmitted through a dielectric screen and coupled with the plasma current) does not lead to the creation of excessively energetic sheaths (the to contact region between plasma and surfaces at high electrical potential) which inevitably generate a population of ions with high directional energies sufficient to cause sputtering. In the case of an ICP source, the preferred antenna configuration is planar because of the ability to obtain plasmas which are uniform over large surfaces.

Moreover, with the reaction chamber configuration shown in FIG. 3 there is the advantage, compared to through flow reactors, that the molecular species which form remain confined within a volume distant from the chamber walls, hence avoiding material losses by deposition. In addition, by changing the injector-plasma distance the reaction time and hence the initial nucleation stages can be controlled, this making a further parameter available for controlling the morphology of the final film (in addition to the opening-substrate distance and the pressure in the deposition chamber).

The illustrated configuration and mutual geometrical arrangement of the elements present in the first chamber enable the apparatus to be extended in one dimension (linear source) or in two dimensions (planar source), hence providing total scalability in view of its use in industrial applications; a series of sources can be provided side by side, each corresponding to the first chamber 10 of FIG. 3, inside a single deposition chamber analogous to the chamber 11 of the same figure.

Figure 4:
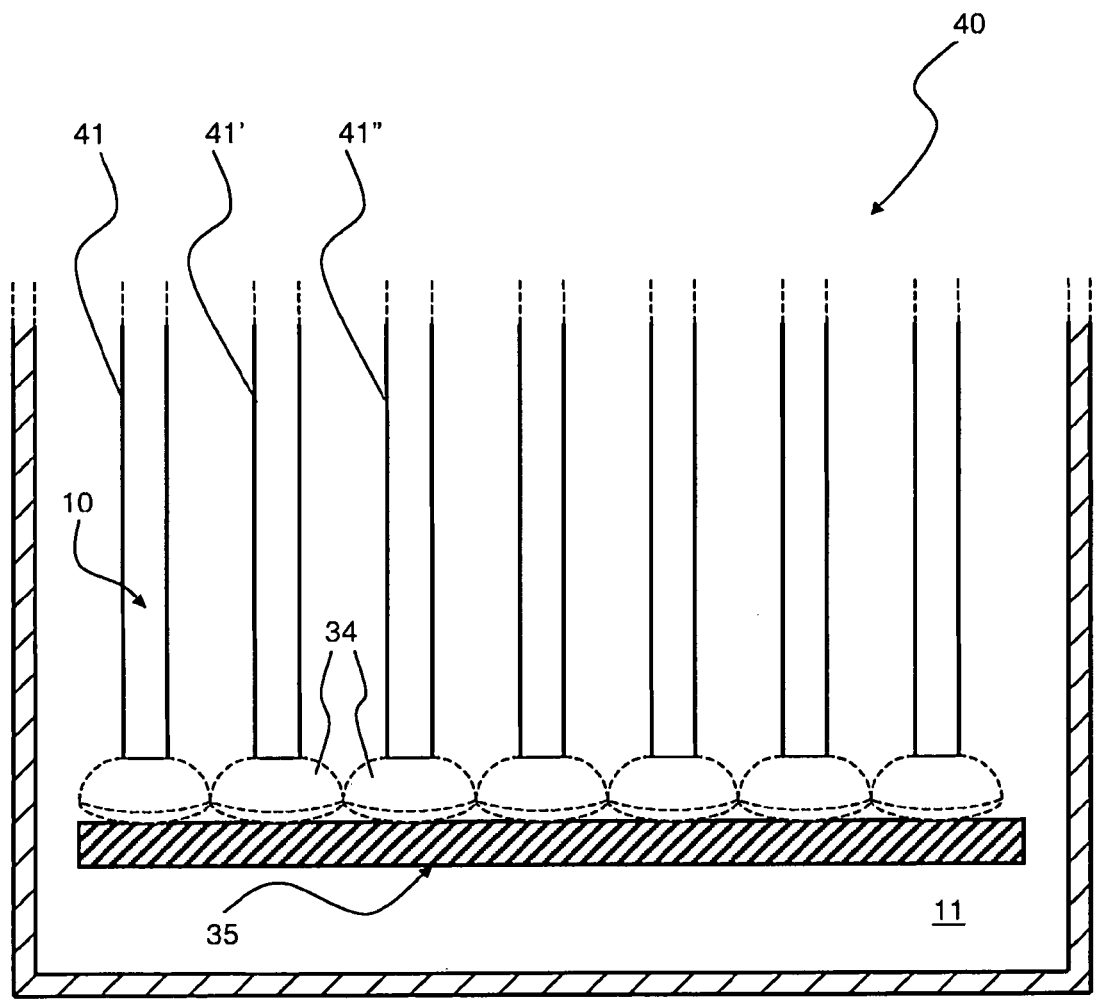
FIG. 4 is a schematic cross-section view of an apparatus according to the invention, formed by joining together several units of the type shown in FIG. 1.

A situation of this type is represented in FIG. 4, which shows an apparatus, 40, comprising a series of "heads" 41, 41', 41", . . . , each equivalent to chamber 10 of FIG. 3, and arranged inside a single deposition chamber 11. With this configuration, by moving the substrate 35 with suitable speed in a direction perpendicular both to the axis of each head 41, 41', 41", . . . , and to the line along which the heads are disposed, it is possible in principle to cover a substrate of indeterminate length (for example, a metal sheet) and then divide the substrate into discrete parts, thus achieving high productivity.

Alternatively, a plurality of heads of type 41, 41', 41", . . . , can be placed side by side to form an array, with each head positioned for example at a node of a rectangular or square matrix to cover, in a single deposition operation, large surfaces such as those required for example for producing solar panels.

The invention claimed is:

1. Method for the production of a nanostructured film having a controlled morphology, comprising the following operations:
    providing at least one first chamber and a second chamber divided by a wall but in fluid communication with each other through one or more openings;
    providing in the first chamber a planar antenna for the creation of a localized plasma, said planar antenna being placed near or against the wall dividing said first and second chambers, such that the surface of the antenna farther from said wall is at a distance "d" of no more than 5 cm from said wall, and having one or more holes in positions corresponding to said one or more openings in said wall;
    creating a planar non-thermal plasma in a zone facing said surface of the antenna farther from the wall dividing said first and second chamber;
    injecting reagents in gas or vapor phase into said first chamber at a point at a distance "h" of no more than 5 cm from said surface of the antenna farther from said wall, so as to cause the reagents to cross the area of the non-thermal plasma, thus defining a reaction zone where the flow of reagents intersects said plasma, in which molecular species of the desired material are produced;
    through said one or more openings, extracting said molecular species from the reaction zone and directing them towards a deposition zone, defined within said second chamber, in which a substrate for the nanostructured film is disposed;
    maintaining the reaction zone at a pressure $P_R$ comprised between 10 and 100,000 Pa, the deposition zone at a pressure $P_D$ comprised between 0.01 and 10,000 Pa, and the ratio $P_R/P_D$ at a value equal to or greater than 3, thus determining a supersonic gas jet containing said molecular species which is directed from the reaction zone to the deposition zone;
    arranging said substrate along the axis of the supersonic jet at a distance comprised between 0.5 and 10 cm from said one or more openings.

2. Method according to claim 1, wherein said pressure $P_R$ is comprised between 10 and 10,000 Pa, and said pressure $P_D$ is between 1 and 3,000 Pa.

3. Method according to claim 1, wherein said distance "d" is lower than 2 cm.

4. Method according to claim 3, wherein said distance "d" is lower than 1.5 cm.

5. Method according to claim 1, wherein said distance "h" is lower than 2 cm.

6. Method according to claim 5, wherein said distance "h" is lower than 1.5 cm.

7. Method according to claim 1, wherein said reagents are at least one precursor compound of an element which can be a metal, a metalloid or another element which is not gaseous at ambient temperature and pressure, and at least one gas which is to react with said precursor.

8. Method according to claim 7, wherein said reagents are diluted in an inert gas.

9. Method according to claim 1, wherein said nanostructured film consists of a metal, a semi-conductor, an oxide, a ceramic compound, a compound with electrically insulating properties, or a conductor compound.

10. Method according to claim 7, wherein said precursor is gaseous at ambient temperature and pressure, and is injected into the reaction zone as such.

11. Method according to claim 7, wherein said precursor is liquid at ambient temperature and pressure, and is injected into the reaction zone in the form of vapor.

12. Method according to claim 11, wherein said vapor is injected into the reaction zone diluted with an inert transport gas or with a reagent gas.

13. Method according to claim 7, wherein said precursor is solid at ambient temperature and pressure and is injected into the reaction zone in the form of vapor obtained by sputtering the solid.

* * * * *

UNITED STATES PATENT AND TRADEMARK OFFICE
CERTIFICATE OF CORRECTION

PATENT NO. : 8,795,791 B2  Page 1 of 1
APPLICATION NO. : 13/512557
DATED : August 5, 2014
INVENTOR(S) : Claudia Riccardi et al.

It is certified that error appears in the above-identified patent and that said Letters Patent is hereby corrected as shown below:

On the title page change item "(76)" to read --(75)--.

On the title page add item (73) Assignee: Universita' Degli Studi Di Milano Bicocca, Milano, IT and Politecnico Di Milano, Milano, IT Signed and Sealed this
Eighth Day of March, 2016

Michelle K. Lee
*Director of the United States Patent and Trademark Office*